(12) United States Patent
Malila et al.

(10) Patent No.: US 11,970,773 B2
(45) Date of Patent: Apr. 30, 2024

(54) APPARATUS AND METHOD FOR ATOMIC LAYER DEPOSITION (ALD)

(71) Applicant: BENEQ OY, Espoo (FI)

(72) Inventors: Matti Malila, Espoo (FI); Pekka Soininen, Espoo (FI)

(73) Assignee: BENEQ OY, Espoo (FI)

( * ) Notice: Subject to any disclaimer, the term of this patent is extended or adjusted under 35 U.S.C. 154(b) by 151 days.

(21) Appl. No.: 17/605,590

(22) PCT Filed: Apr. 24, 2020

(86) PCT No.: PCT/FI2020/050267
§ 371 (c)(1),
(2) Date: Oct. 22, 2021

(87) PCT Pub. No.: WO2020/216994
PCT Pub. Date: Oct. 29, 2020

(65) Prior Publication Data
US 2022/0275512 A1 Sep. 1, 2022

(30) Foreign Application Priority Data
Apr. 25, 2019 (FI) ...................................... 20195334

(51) Int. Cl.
*C23C 16/455* (2006.01)
*C23C 16/458* (2006.01)

(52) U.S. Cl.
CPC .. *C23C 16/45546* (2013.01); *C23C 16/45529* (2013.01); *C23C 16/45551* (2013.01); *C23C 16/4583* (2013.01)

(58) Field of Classification Search
CPC ......... H01L 21/67748; H01L 21/68742; H01L 21/68792
See application file for complete search history.

(56) References Cited

U.S. PATENT DOCUMENTS

| 5,709,543 A | 1/1998 | Shimazu |
| 2003/0038127 A1* | 2/2003 | Liu ...................... H01L 21/6719 219/400 |

(Continued)

FOREIGN PATENT DOCUMENTS

| KR | 100698504 B1 | 3/2007 |
| WO | 2009144371 A1 | 12/2009 |
| WO | 2014147290 A1 | 9/2014 |

OTHER PUBLICATIONS

Finnish Search Report issued by the Finnish Patent and Registration Office in relation to Finnish Application No. 20195334 dated Nov. 21, 2019 (2 pages).

(Continued)

*Primary Examiner* — Joseph A Miller, Jr.
(74) *Attorney, Agent, or Firm* — Robert P. Michal, Esq.; Carter, DeLuca & Farrell LLP

(57) ABSTRACT

An apparatus and a method for processing one or more substrates in a batch process according to the principles of atomic layer deposition (ALD) includes a reaction chamber, a chamber plate for closing the reaction chamber, a motor arranged to move the chamber plate between an open position, in which the reaction chamber is open, and a closed position, in which the reaction chamber is closed, and an actuator arm mechanism connected to said motor. The actuator arm mechanism having three or more actuator arms having a distal end, which is connected to the chamber plate, the distal ends of the three or more actuator arms define a plane on the chamber plate.

12 Claims, 9 Drawing Sheets

(56) References Cited

U.S. PATENT DOCUMENTS

| | | | |
|---|---|---|---|
| 2005/0034664 A1 | 2/2005 | Koh et al. | |
| 2005/0045101 A1* | 3/2005 | Ishihara | C23C 14/50 118/719 |
| 2006/0231382 A1* | 10/2006 | Mullapudi | C23C 14/566 204/192.1 |
| 2011/0003482 A1 | 1/2011 | Ogawa et al. | |
| 2014/0150878 A1 | 6/2014 | Merry et al. | |
| 2015/0376786 A1 | 12/2015 | Yudovsky et al. | |
| 2018/0096874 A1 | 4/2018 | Schaller et al. | |
| 2018/0315626 A1 | 11/2018 | Franklin | |

OTHER PUBLICATIONS

International Search Report issued by the Finnish Patent and Registration Office acting as the International Searching Authority in relation to International Application No. PCT/FI2020/050267 dated Aug. 19, 2020 (4 pages).
Written Opinion of the International Searching Authority issued by the Finnish Patent and Registration Office acting as the International Searching Authority in relation to International Application No. PCT/FI2020/050267 dated Aug. 19, 2020 (9 pages).

\* cited by examiner

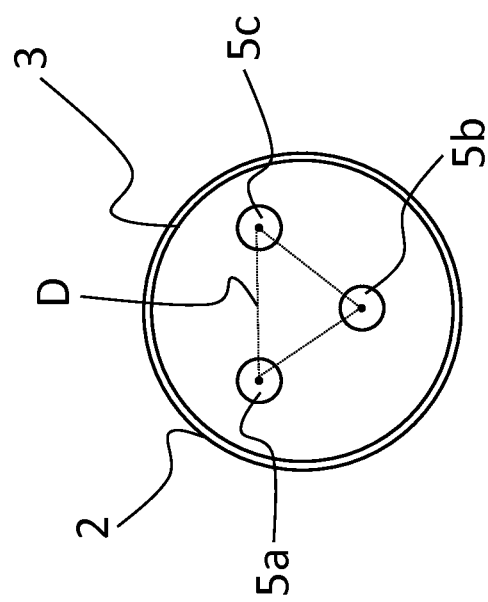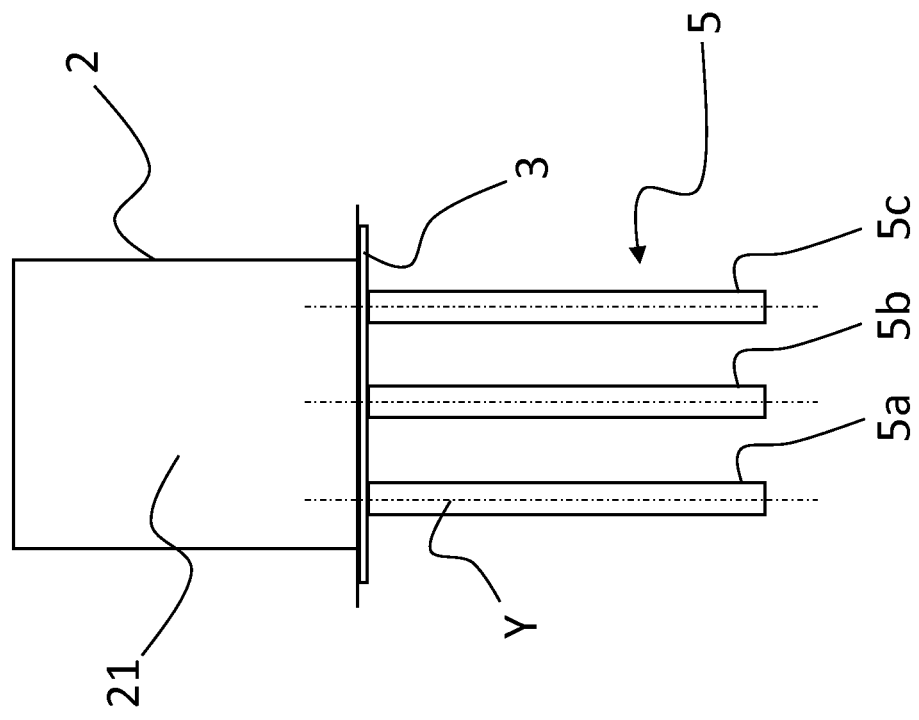
Fig. 2a
Fig. 2b

APPARATUS AND METHOD FOR ATOMIC LAYER DEPOSITION (ALD)

CROSS-REFERENCE TO RELATED APPLICATIONS

This application is a national phase entry under 35 U.S.C. 371 of PCT International Application No. PCT/FI2020/050267 filed Apr. 24, 2020, which claims priority to Finnish Patent Application No. 20195334, filed Apr. 25, 2019, the disclosure of each of these applications is expressly incorporated herein by reference in their entirety.

FIELD OF THE INVENTION

The present invention relates to an apparatus for processing one or more substrates in a batch process.

The present invention also relates to a method for processing one or more substrates in a batch process.

BACKGROUND OF THE INVENTION

The present invention relates to an apparatus and a method for processing substrates by subjecting at least part of the surface of the substrate to alternating surface reactions of two or more precursor materials. More particularly the present invention relates to an apparatus and a method for processing substrates according to the principles of atomic layer deposition (ALD). In this application the term ALD means atomic layer epitaxy (ALE) and other similarly named methods realizing the principles of ALD. The atomic layer deposition apparatuses typically comprise a vacuum chamber inside which the substrates are processed. A separate reaction chamber may also be arranged inside the vacuum chamber such that the substrates are loaded into the reaction chamber and processed in the reaction chamber. The loading of the substrates may be carried out manually or by a loading device such as a loading robot. Conventionally the loading of the substrates into the ALD apparatus is carried out in normal ambient atmosphere, room atmosphere or atmosphere of a clean room.

WO 2009/144371 discloses an apparatus in which material is deposited on surfaces of a batch of vertically placed substrates in a reaction chamber. In the publication a batch of vertically placed substrates comprises a set of wafers placed in parallel into a movable substrate holder. The substrate holder is attached to a movable reaction chamber lid and the reaction chamber size is specially optimized for the size of the batch of vertically placed substrates or for the size of a substrate holder carrying the substrates. The reaction chamber is closed by a thread connection.

The thread connection makes closing of the reaction chamber time consuming. Another way to form a closed reaction chamber is by moving the chamber lid in contact with the reaction chamber body. However, the connection of the chamber lid and the reaction chamber body may not be tight because of inaccuracies in the chamber lid and/or the reaction chamber body.

BRIEF DESCRIPTION OF THE INVENTION

An object of the present invention is to provide an apparatus and a method for processing one or more substrates in a batch process in which closing the reaction chamber is performed simply and securely such that the reaction chamber is tightly closed. An object of the present invention is also to provide an apparatus and a method for processing one or more substrates in a batch process in which the orientation of a substrate rack can be adjusted in relation to the reaction chamber body or in relation to a loading mechanism arranged to load substrates to be processed in the reaction chamber.

The objects of the invention are achieved by an apparatus and a method which are characterized by what is stated in the independent claims. The preferred embodiments of the invention are disclosed in the dependent claims.

The invention is based on the idea of providing an apparatus for processing one or more substrates in a batch process by subjecting at least part of a surface of a substrate to alternating surface reactions of at least a first and second starting materials according to the principles of atomic layer deposition (ALD) in which the apparatus comprises a reaction chamber forming a reaction space within the reaction chamber; a chamber plate for closing the reaction chamber such that a closed reaction space is formed within the reaction chamber. The apparatus may further comprise a substrate rack for holding a substrate batch comprising one or more substrates, which the substrate rack is provided in connection with the chamber plate such that the substrate rack is provided within the closed reaction space for processing the one or more substrates. As an example, the substrate rack can be provided on a surface of the chamber plate facing toward the reaction space or the substrate rack can be arranged to hang from the chamber plate when the reaction chamber is arranged such that the chamber plate closes the reaction chamber from above. Alternatively the chamber plate may comprise a substrate holder in connection with the chamber plate such that a substrate is arranged to the substrate holder for processing the substrate in the reaction chamber. The apparatus further comprises a motor arranged to move the chamber plate in a first direction between an open position of the reaction chamber and a closed position of the reaction chamber. The first direction is preferably a vertical direction or substantially vertical direction. In the open position the reaction chamber is open and in the closed position the reaction chamber is closed such that when the apparatus comprises the substrate rack, then the substrate rack is provided within the reaction chamber in the closed reaction space. The apparatus further comprises an actuator arm mechanism connected to the motor. The actuator arm mechanism has three or more actuator arms. Each of the three or more arms have a distal end and a proximal end and the distal end is connected to the chamber plate. The distal ends of the three or more actuator arms define a plane on the chamber plate. This means that the three or more actuator arms are arranged in connection with the chamber plate such a plane is defined by the distal ends of the actuator arms. In other words, the actuator arms are not provided in a row on the chamber plate. Each of the three or more actuator arms have a distal end, which the distal end is connected to the chamber plate and the distal ends of the three or more actuator arms define a plane on the chamber plate. This means that the distal ends of the three or more actuator arms are positioned to the chamber plate such that they define corners of a plane formed on the chamber plate.

The actuator arm mechanism which is connected to the motor is arranged to close the reaction chamber with the chamber plate by moving the chamber plate in a first direction such that the substrate rack is provided within the reaction chamber in the reaction space. The chamber plate is moved by the actuator arm mechanism in an opposite direction than the first direction when the reaction chamber is opened and the substrates are unloaded from the substrate rack. In other words, the chamber plate is moved in a first direction from an open position into a closed position, and in a second direction which is opposite to the first direction from the closed position into the open position.

The actuator arm mechanism comprises three or more actuator arms and an adjustment mechanism in connection with at least one of the three or more actuator arms. The actuator arm mechanism having a connection to the motor is arranged to move the chamber plate toward the reaction chamber to a position in which the chamber plate is arranged to close the reaction chamber and the adjustment mechanism is arranged to adjust the orientation of the chamber plate relative to the reaction chamber when the chamber plate is pressed against the reaction chamber to tighten and seal the connection between the chamber plate and the reaction chamber. The adjustment mechanism is also arranged to adjust the orientation of the chamber plate relative to the loading mechanism arranged to load substrates to the substrate holder or to the substrate rack such that the orientation of the substrate holder either in the substrate rack or as a singular substrate holder in connection with the chamber plate is provided parallel to the substrate in the loading mechanism. In other words, the substrate holder should be in a right level relative to the substrate to be loaded to the substrate holder and the substrate holder should have the same orientation as the substrate to be loaded to the substrate holder with the loading mechanism. The right level and the orientation of the substrate holder is provided by the adjustment mechanism together with the actuator arms.

According to an embodiment of the invention the apparatus comprises two motors connected to the actuator arm mechanism such that one of the two motors is connected to one of the three or more actuator arms for moving the one of the three or more actuator arms and the other one of the two motors is connected to the actuator arm mechanism for moving the rest of the three or more actuator arms.

According to an embodiment of the invention the apparatus comprises three or more motors connected to the three or more actuator arms such that each of the three or more actuator arms comprising the motor arranged to move each of the three or more actuator arms separately. In other words, each of the actuator arms comprises a motor for actuating the actuator arms separately from the other actuator arms. By moving each of the actuator arms separately the orientation of the chamber plate can be controlled.

According to an embodiment of the invention the apparatus further comprises an adjustment mechanism in connection with at least one of the three or more actuator arms. Sais adjustment mechanism is arranged to adjust orientation of the chamber plate relative to the reaction chamber. This is especially convenient when closing the reaction chamber with chamber plate and tightening the chamber plate towards the reaction chamber.

According to an embodiment of the invention the adjustment mechanism comprises a first adjustment mechanism which is arranged at the distal end of at least one of the three or more actuator arms such that the distal end of the at least one of the three or more actuator arms is connected to the chamber plate through the first adjustment mechanism. In other words, the adjustment mechanism is provided to the distal end of at least one of the actuator arms and the adjustment mechanism forms part of the actuator arm to which it is provided such that the connection between the distal end of the actuator arm and the chamber plate is provided as a connection between the adjustment mechanism and the chamber plate.

According to an embodiment of the invention the each of the three or more actuator arms have a proximal end, which is opposite to the distal end; and the adjustment mechanism comprises a second adjustment mechanism which is arranged at the proximal end of at least one of the three or more actuator arms.

According to an embodiment of the invention the first adjustment mechanism is a spring or an elastic member or a pneumatic member; or the second adjustment mechanism is a spring or an elastic member or a pneumatic member; or the first adjustment mechanism and the second adjustment mechanism is a spring or an elastic member or a pneumatic member. The elastic member can be for example a rubber member or similar flexible member.

The motor and the adjustment mechanism enables the positioning of the chamber plate relative to the reaction chamber such that the chamber plate can be aligned correctly to the reaction chamber and the connection between the chamber plate and the reaction chamber is tight. In an advantageous embodiment of the invention when each of the three or more actuator arms comprise a motor the chamber plate can be particularly closely aligned relative to the reaction chamber. This is advantageous for example when the substrate rack is relatively high and the reaction chamber is narrow so that the substrate rack would touch a wall of the reaction chamber at its upper end if the position of the chamber plate to which the substrate rack is provided, is not corrected.

According to an embodiment of the invention the three or more actuator arms are connected together such that a combined actuator arm mechanism is formed, said combined actuator arm mechanism having a common main actuator arm. At least one of the three or more actuator arms comprise a first adjustment mechanism which is arranged at the distal end of the at least one of the three or more actuator arms such that the distal end of the at least one of the three or more actuator arms is connected to the chamber plate through the first adjustment mechanism. The motor is connected to the main actuator arm and arranged to move the main actuator arm in the first direction.

According to an embodiment of the invention the motor is a servo motor; or the motor is a servo motor having a position determination feature.

According to an embodiment of the invention the apparatus further comprises a vacuum chamber forming a vacuum space within the vacuum chamber such that the reaction chamber is provided inside the vacuum chamber; and a separation element provided to the vacuum chamber for separating the three or more actuator arms from the vacuum chamber such that the three or more actuator arms are operably connected to the chamber plate for moving the chamber plate inside the vacuum chamber by the three or more actuator arms) from outside of the vacuum chamber.

According to an embodiment of the invention the separation element is extending from the vacuum chamber through the vacuum space to the chamber plate for separating the three or more actuator arms from the vacuum space; or alternatively the separation element is extending from the vacuum chamber through the vacuum space to the distal end of each of the three or more actuator arms for separating the three or more actuator arms from the vacuum space; or alternatively the separation element is extending from a wall of the vacuum chamber through the vacuum space to between the distal end of each of the three or more actuator arms and the chamber plate for separating the three or more actuator arms from the vacuum space.

According to an embodiment of the invention the separation element is an expandable element allowing movement of the three or more actuator arms while separating the three or more actuator arms from the vacuum space. The expandable element is for example a bellow.

According to an embodiment of the invention the separation element for separating the three or more actuator arms is provided in connection with the actuator arms such that the three or more actuator arms are within the same separation element such that the separation element surrounds the three or more actuator arms within the vacuum space.

According to another embodiment of the invention the separation element for separating the three or more actuator arms is provided in connection with the actuator arms such that the three or more actuator arms are provided separately such that the separation element surrounds each of the three or more actuator arms separately within the vacuum space.

According to another embodiment of the invention the three or more actuator arms are operating within the vacuum chamber such that the separation element separates the vacuum space and the three or more actuator arms. The three or more actuator arms are provided within the vacuum chamber through at least one opening in the vacuum chamber. The at least one opening comprises a lip seal for sealing the space between the opening and the actuator arm such that the actuator arm slides through the opening comprising the lip seal.

According to the invention the apparatus preferably comprises a substrate holder in connection with the chamber plate or a substrate rack in connection with the chamber plate for holding a substrate batch comprising one or more substrates.

According to the method of the invention for processing one or more substrates in a batch process by subjecting at least part of a surface of a substrate to alternating surface reactions of at least a first and second starting materials according to the principles of atomic layer deposition (ALD) in a reaction chamber forming a reaction space within the reaction chamber, the reaction chamber comprises a chamber plate for closing the reaction chamber by the chamber plate, in which method the chamber plate is moved by a motor between an open position, in which the reaction chamber is open, and a closed position, in which the reaction chamber is closed, by the chamber plate and at least one loading position between the open position and the closed position, in which the substrates are loaded for processing the substrates in the reaction chamber when the reaction chamber is closed by moving the chamber plate to the closed position. The method comprises moving the chamber plate in a first direction, providing an actuator arm mechanism having three or more actuator arms and connecting a distal end of each of the three or more actuator arms to the chamber plate such that a plane is defined on the chamber plate; and moving the chamber plate to at least one predetermined loading position with the motor provided in connection with the actuator arm mechanism.

In other words, the open position is the position of the chamber plate in which the reaction chamber is open or in which the substrate rack, if there is one, is provided such that the substrate rack is completely outside the reaction chamber. The closed position is the position of the chamber plate in which the chamber plate is provided against the reaction chamber so as to form a closed reaction chamber with a reaction space within the reaction chamber. The open position can be simultaneously the at least one loading position especially in a case when the substrate is loaded to the chamber plate or to a substrate holder in connection with the chamber plate. However preferably there is at least one loading position between the open position and the closed position and more preferably multiple loading positions between the open position and the closed position. In an embodiment in which the chamber plate carries a substrate rack the chamber plate is moved from the open position to the closed position such that there are two or more loading positions between the open position and the closed position.

In a preferred embodiment of the invention the chamber plate is moved by three motors connected to the three or more actuator arms such that the orientation of the chamber plate in relation to the reaction chamber or in relation to a loading mechanism arranged to load substrates to a substrate holder or a substrate rack provided in connection with the chamber plate can be adjusted. In other words, the method comprises a step of adjusting the orientation of the chamber plate in relation to the reaction chamber and/or in relation to the loading mechanism. The step of adjusting the orientation of the chamber plate comprises a step of moving at least one of the actuator arms relative to the other actuator arms by means of a motor coupled to the actuator arm.

According to an embodiment of the invention the method comprises providing an adjustment mechanism to the actuator arm mechanism by arranging the adjustment mechanism in connection with at least one of the three or more actuator arms; and adjusting orientation of the chamber plate in relation to the reaction chamber by the adjustment mechanism.

According to an embodiment of the invention the method comprises moving the chamber plate to the closed position for closing the reaction chamber by the chamber plate; and adjusting the orientation of the chamber plate in the closed position by the adjustment mechanism for tightening the connection between the chamber plate and the reaction chamber.

According to an embodiment of the invention the method comprises adjusting the orientation of the chamber plate in relation to the reaction chamber or adjusting the orientation of the chamber plate in relation to a loading mechanism arranged to load substrates to a substrate holder or to a substrate rack in connection with the chamber plate.

An advantage of the invention is that the position and/or the orientation of the chamber plate which can carry a substrate holder or a substrate rack relative to the reaction chamber and/or relative to a loading mechanism can be adjusted. The position and/or the orientation of the chamber plate can be adjusted while the chamber plate is moved to the closed position or during the loading of the substrates or in a position in which at least part of the chamber plate already touches the reaction chamber. The position and/or the orientation of the chamber plate can be adjusted when the substrate rack is moved inside the reaction chamber or when the substrate rack is already at least partly inside the reaction chamber. Therefore the reaction chamber can be formed such that no extra space is needed because the orientation of the substrate rack can be adjusted so that it is ideally placed within the reaction chamber. Another advantage of the invention is that when the vacuum changes the reaction chamber or the heat movement affects the reaction chamber the position and/or the orientation of the chamber plate relative to the reaction chamber can be adjusted.

BRIEF DESCRIPTION OF THE DRAWINGS

The invention is described in detail by means of specific embodiments with reference to the enclosed drawings, in which FIG. 1 show an embodiment of the apparatus according to the invention;

FIG. 2a shows an embodiment of a chamber plate of the apparatus according to the invention as seen from below;

FIG. 2b shows an embodiment of the apparatus according to the invention;

DETAILED DESCRIPTION OF THE INVENTION

Figure 1:
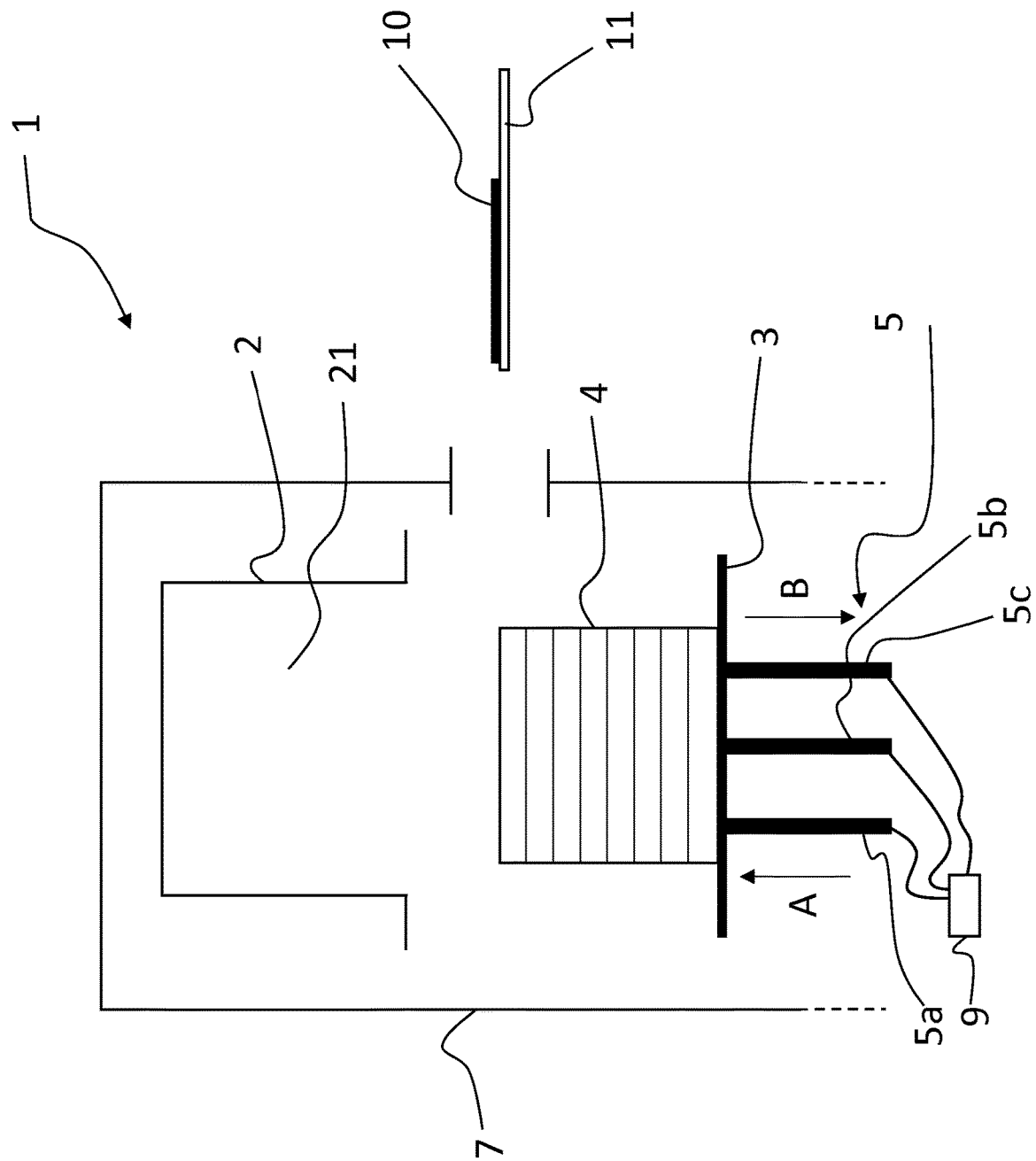

FIG. 1 shows an embodiment of the apparatus 1 according to the invention in which a reaction chamber 2 having a reaction space 21 is in an open position such that a chamber plate 3, to which a substrate rack 4 is provided on the chamber plate 3, is arranged such that a substrate 10 can be loaded onto the uppermost level of the substrate rack 3 with a loading arm 11 which is arranged to move horizontally. The chamber plate 3 is arranged to be moved in a vertical direction between an open position, in which the reaction chamber 2 is open and the chamber plate 3 is moved away from the reaction chamber 2, and a closed position, in which the reaction chamber 2 is closed by the chamber plate 3 such that a closed reaction space 21 is formed. The chamber plate 3 in other words forms part of the reaction chamber 2 forming the closed reaction space 21 when the reaction chamber is in the closed position. The chamber plate 3 is moved by a motor 9 in a first direction A between the open position and the closed position and in a second direction B which is opposite to the first direction between the closed position and the open position. In other words, the first direction A is when the chamber plate 3 is moved to close the reaction chamber 2 and the second direction B is when the chamber plate 3 is moved to open the reaction chamber 2. The motor 9 is connected to an actuator arm mechanism 5 which comprises in the embodiment of FIG. 1 three actuator arms 5a, 5b, 5c but which can comprise three or more actuator arms. Each of the three or more actuator arms 5a, 5b, 5c have a distal end, which is connected to the chamber plate 3 and the actuator arms 5a, 5b, 5c are provided on the chamber plate 3 such that the distal ends of the three or more actuator arms 5a, 5b, 5c define a plane on the chamber plate 3. In other words, although in the FIG. 1 the actuator arms 5a, 5b, 5c seem to be arranged in a row, they actually are arranged such that they form a plane on the chamber plate 3. This is shown in FIG. 2a. In the embodiment shown in FIG. 1 the motor 9 is connected to the actuator arms 5a, 5b, 5c for moving the chamber plate 3 with the actuator arms 5a, 5b, 5c in the first direction A and in the second direction B, i.e. substantially vertically, for closing the reaction chamber 2 with the chamber plate 3 and for opening the reaction chamber 2. In the embodiment of FIG. 1 the reaction chamber is provided within a vacuum chamber 7.

FIG. 2a shows an embodiment of the chamber plate 3 as seen from below. In this embodiment of the invention the apparatus 1 comprises three actuator arms 5a, 5b, 5c which are provided on the chamber plate 3 such that they define a plane D (shown in the FIG. 2a with a dashed line). In other words, the actuator arms 5a, 5b, 5c define corners of a plane D forming a triangle or in particularly the axis of the actuator arms 5a, 5b, 5c define corners of a plane D forming a triangle. In this embodiment of the invention the chamber plate 3 is circular, but the invention is not limited to any particular form of the chamber plate 3. However, the circular chamber plate 3 is most advantageous form of the chamber plate 3. The reaction chamber 2 preferably comprises a flange portion against which the chamber plate 3 is pressed and the flange portion of the reaction chamber 2 is shown in FIG. 2a also.

FIG. 2b shows an embodiment of the apparatus 1 in which the reaction chamber 2 is in a closed position such that the chamber plate 3 is pressed against the reaction chamber 2. When the chamber plate 3 is pressed against the reaction chamber 2 a closed reaction space 21 is formed. The three actuator arms 5a, 5b, 5c having a connection to at least one motor (not shown in FIG. 2b) are provided in connection with the chamber plate 3. FIG. 2b shows that the actuator arms 5a, 5b, 5c have an axis Y in the longitudinal direction of the actuator arms. The axis Y is shown in FIG. 2a as a dot defining the corners of a plane D formed between the actuator arms.

Figures 3A, 3B:
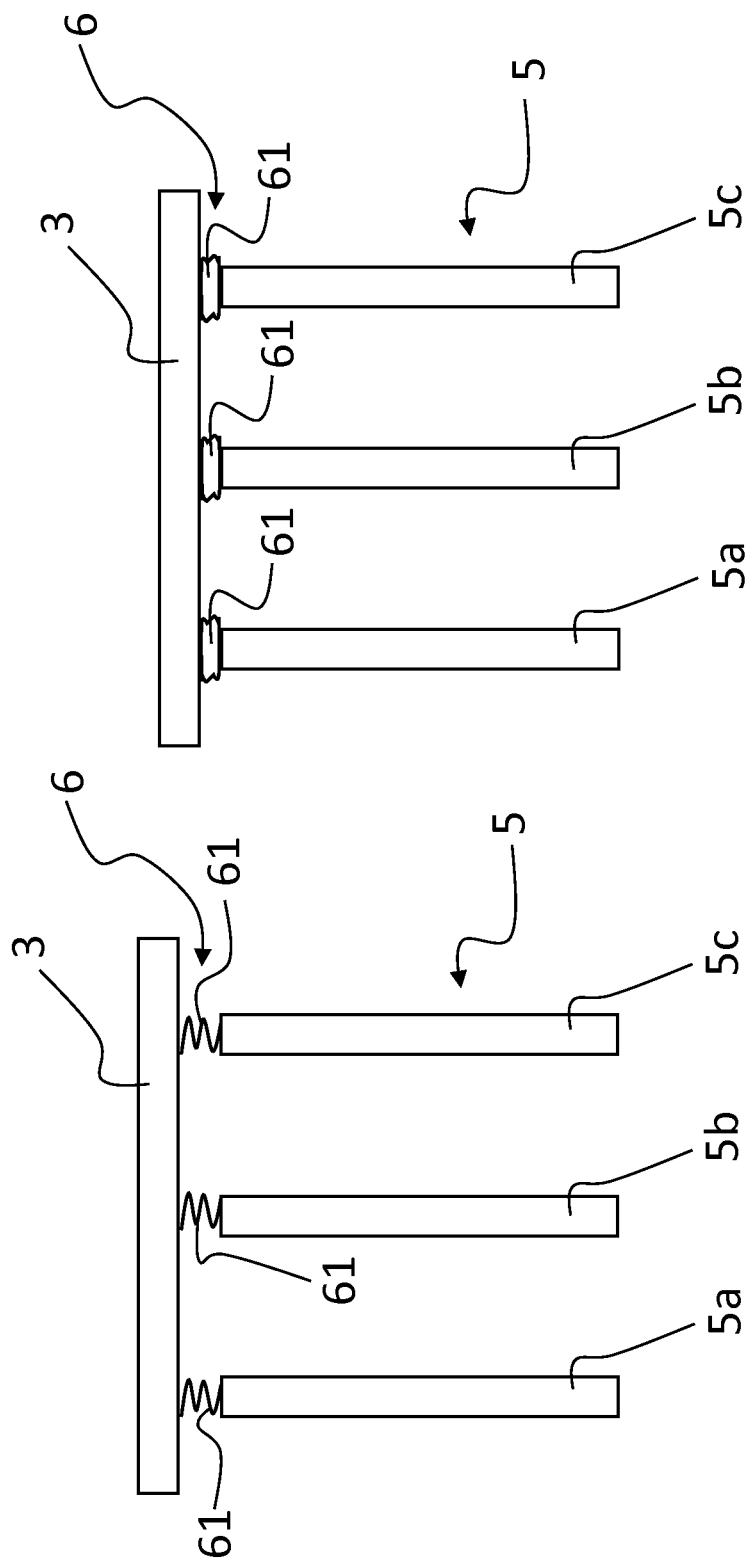
FIGS. 3a and 3b show embodiments of the first adjustment mechanism in the apparatus according to the invention.

FIGS. 3a and 3b show embodiments of the adjustment mechanism 6 and in particularly the first adjustment mechanism 61 in the apparatus 1 according to the invention. In FIG. 3a the first adjustment mechanism 61 is a spring arranged at the distal end of each of the actuator arms 5a, 5b, 5c. The connection between the actuator arm and the chamber plate 3 is provided through the first adjustment mechanism 61, i.e. through the spring. FIG. 3b shows another embodiment of the first adjustment mechanism 61 which is an elastic member arranged at the distal end of each of the actuator arms 5a, 5b, 5c. The connection between the actuator arm 5a, 5b, 5c and the chamber plate 3 is provided through the first adjustment mechanism 61, i.e. through the elastic member. The spring and elastic member are only examples of the first adjustment mechanism and any other member that is flexible or elastic so as to receive compression force is suitable as the first adjustment mechanism 61.

Figures 4A, 4B:
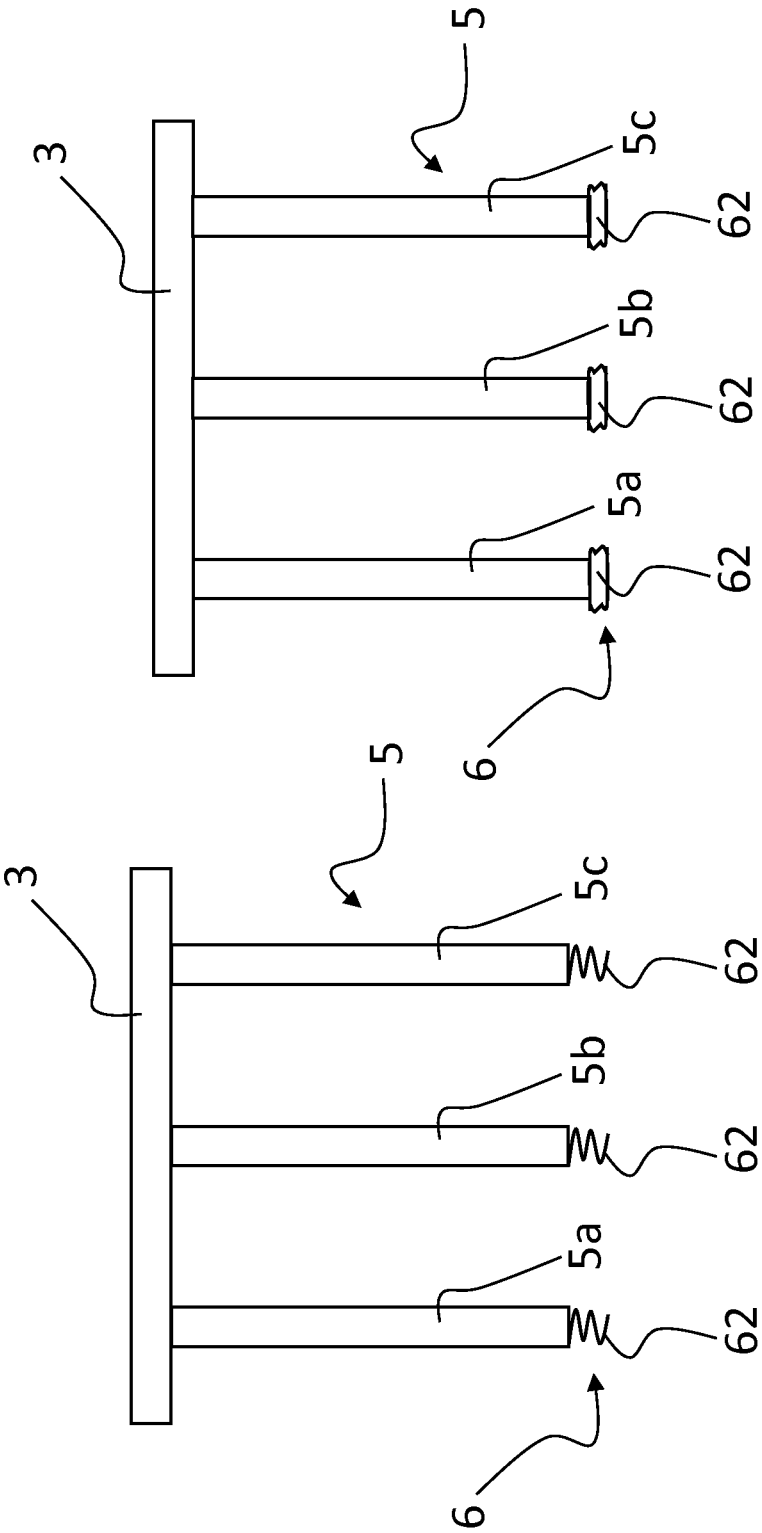
FIGS. 4a and 4b show embodiments of the second adjustment mechanism in the apparatus according to the invention.

FIGS. 4a and 4b show embodiments of the adjustment mechanism 6 and in particularly the second adjustment mechanism 62 in the apparatus 1 according to the invention. In these embodiments of the invention the adjustment mechanism 6 is provided at the proximal end of the actuator arm 5a, 5b, 5c, which the proximal end is opposite the distal end connected to the chamber plate 3. FIG. 4a shows an embodiment in which the second adjustment mechanism 62 is a spring arranged at the proximal end of each of the actuator arms 5a, 5b, 5c. FIG. 4b shows an embodiment in which the second adjustment mechanism 62 is an elastic member arranged at the proximal end of each of the actuator arms 5a, 5b, 5c. The second adjustment member 62 can be arranged between the actuator arm 5a, 5b, 5c and a common actuator arm mechanism or the actuator arm 5a, 5b, 5c can comprise part that are connected through the second adjustment mechanism 62. The spring and elastic member are only examples of the second adjustment mechanism and any other member that is flexible or elastic so as to receive compression force is suitable as the second adjustment mechanism 62.

Figure 5:
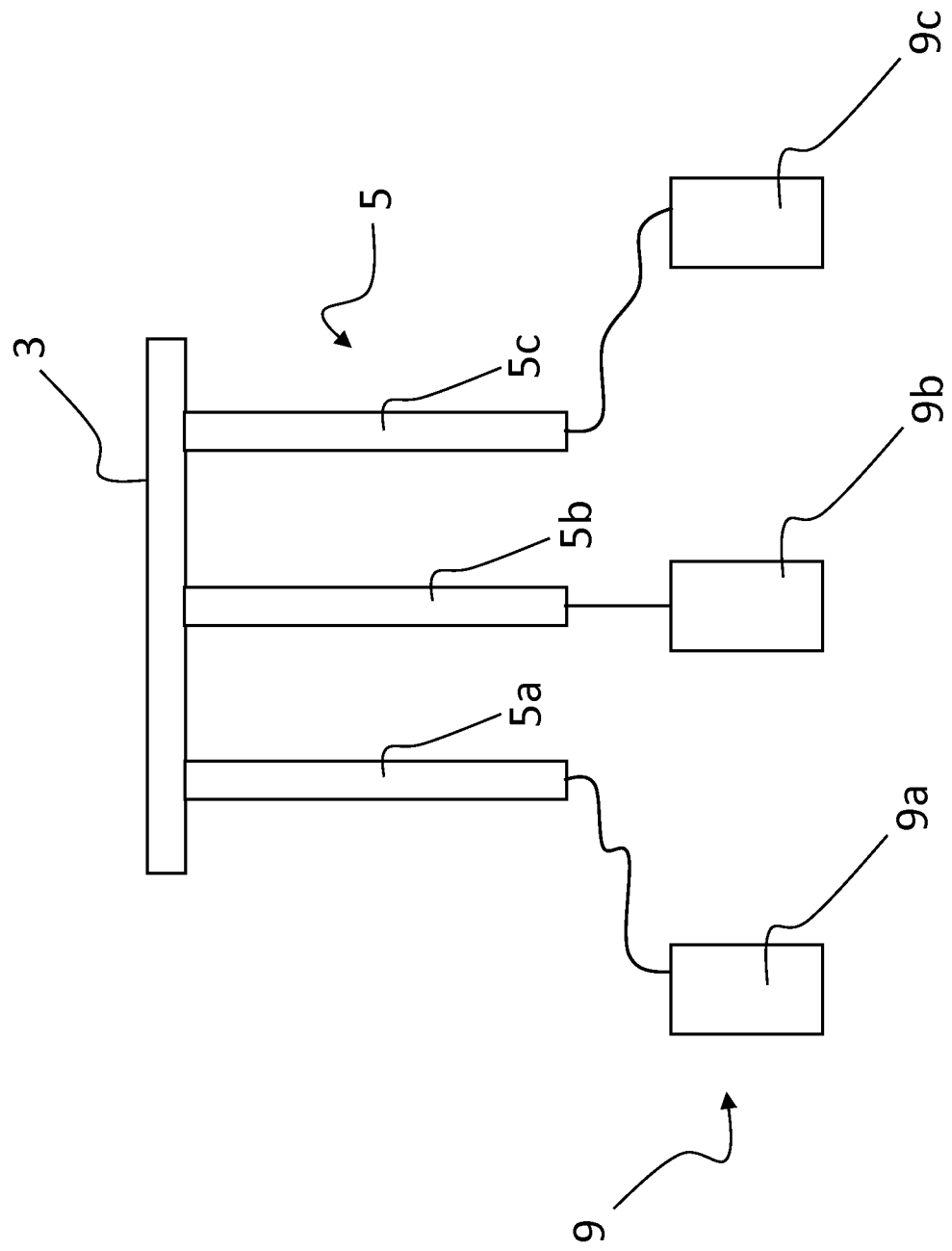
FIG. 5 shows an embodiment of the apparatus according to the invention.

FIG. 5 shows an embodiment of the apparatus according to the invention in which each of the three actuator or more arms 5a, 5b, 5c comprise a motor 9 arranged to move the actuator arms 5a, 5b, 5c separately. Although not shown in FIG. 5 at least one of the three or more actuator arms 5a, 5b, 5c may also comprise also the first or the second adjustment mechanism 61, 62. In another embodiment of the invention the apparatus comprises two motors 9 connected to the actuator arm mechanism 5 such that one of the two motors 9 is connected to one of the three or more actuator arms 5a, 5b, 5c for moving the one of the three or more actuator arms 5a, 5b, 5c and the other one of the two motors 9 is connected to the actuator mechanism 5 such that it is arranged to move the other actuator arms 5a, 5b, 5c. This allows the orientation of the chamber plate 3 to be adjusted relative to the reaction chamber 2.

Figure 6:
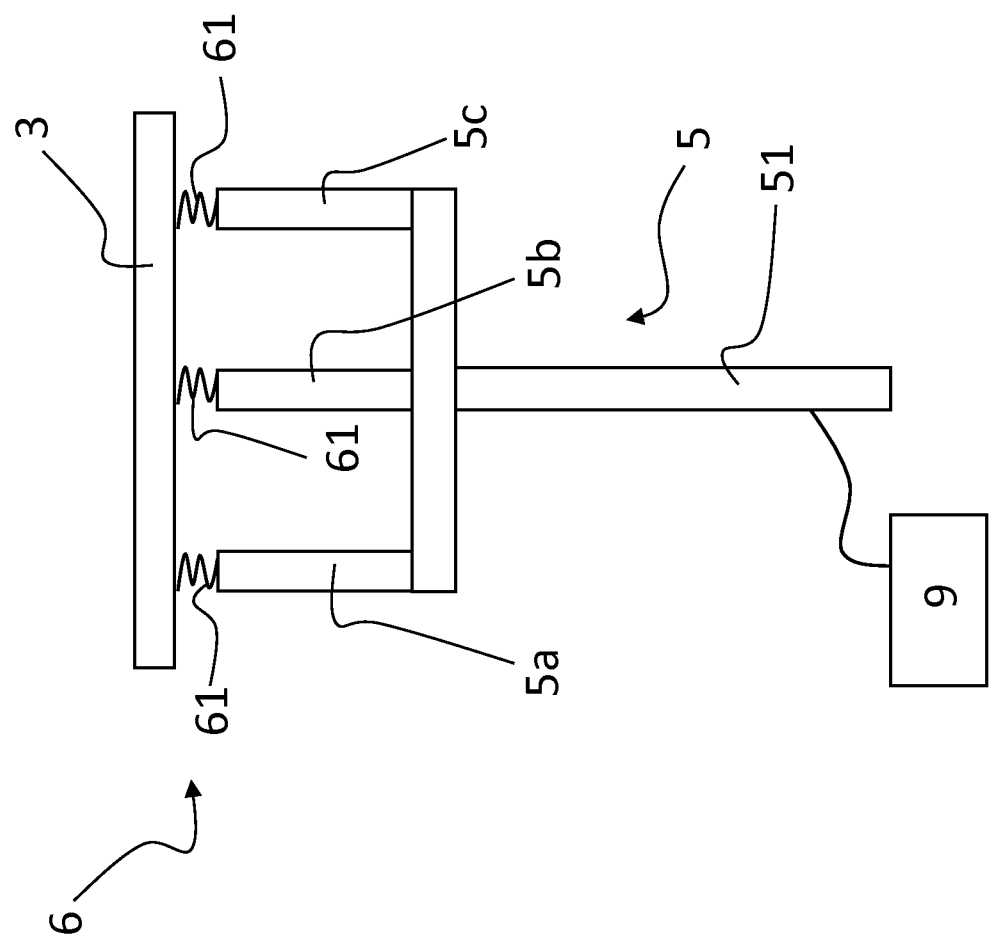
FIG. 6 shows one embodiment of the apparatus according to the invention.

FIG. 6 shows one embodiment of the apparatus according to the invention in which the three actuator arms 5a, 5b, 5c are connected together such that a combined actuator arm mechanism 5 is formed. The combined actuator arm mechanism 5 has a common main actuator arm 51. In the embodiment shown in FIG. 6 each of the three actuator arms 5a, 5b, 5c comprise a first adjustment mechanism 61 which is arranged at the distal end of the three actuator arms 5a, 5b, 5c such that the distal end of the three actuator arms 5a, 5b, 5c is connected to the chamber plate 3 through the first adjustment mechanism 61. Although the FIG. 6 shows three actuator arms 5a, 5b, 5c the apparatus can comprise more than three actuator arms. The motor 9 is connected to the main actuator arm 51 and arranged to move the chamber plate 3 through the main actuator arm 51 in the first direction A and back to the second direction B.

Figure 7:
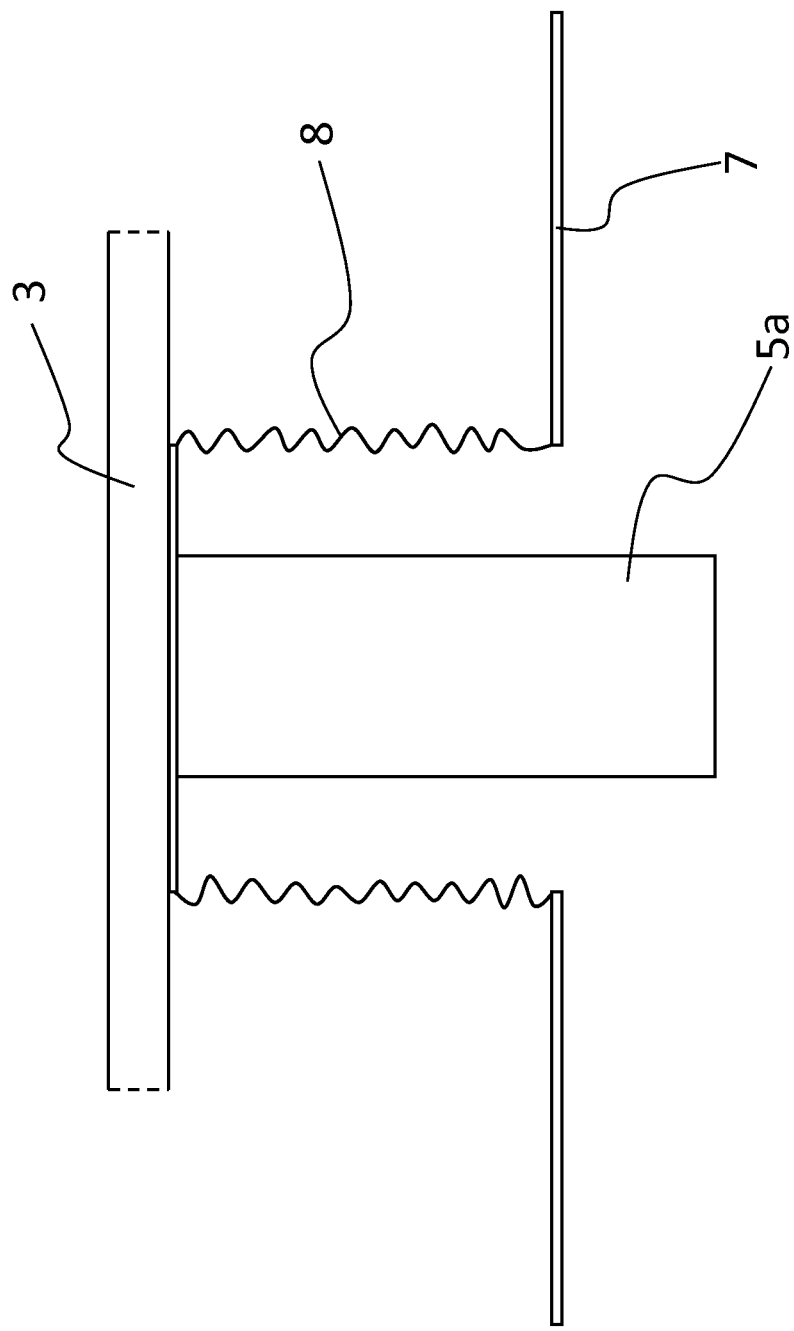
FIG. 7 shows another embodiment of the apparatus according to the invention.

FIG. 7 shows another embodiment of the apparatus according to the invention in which the apparatus 1 further comprises a separation element 8 arranged to the vacuum chamber 7 for separating the three or more actuator arms 5a, 5b, 5c from the vacuum chamber 7. The separation element 8 is part of the vacuum chamber 7 for keeping vacuum within the vacuum chamber 7. The separation element 8 allows the movement of the chamber plate 3 provided within the vacuum chamber 7 through the three or more actuator arms 5a, 5b, 5c connected to at least one motor 9 (not shown in FIG. 7).

In other words, the three or more actuator arms 5a, 5b, 5c arranged outside the vacuum chamber 7 are operably connected to the chamber plate 3 for moving the chamber plate 3 inside the vacuum chamber 7 between the open position and the closed position. The three or more actuator arms 5a, 5b, 5c are operating from outside of the vacuum chamber 7 for moving the chamber plate 3 within the vacuum chamber 7 such that the separation element 8 forms part of the vacuum chamber 7 between the chamber plate 3 and the three or more actuator arms 5a, 5b, 5c. The separation element 8 is preferably an expandable element for example a metal or steel element which comprises an expandable portion or which is expandable for example through folds. The part of the separation element 8 arranged between the chamber plate 3 and the actuator arm 5a can be a planar part. In other words, the separation element 8 is an expandable element allowing movement of the three or more actuator arms 5a, 5b, 5c while separating the three or more actuator arms 5a, 5b, 5c from the vacuum space 71.

In an embodiment of the invention the separation element 8 is arranged to extend from the vacuum chamber 7 through the vacuum space 71 to the chamber plate 3 for separating the three or more actuator arms 5a, 5b, 5c from the vacuum space 71. The three or more actuator arms 5a, 5b, 5c can be separately or together separated from the vacuum chamber 7.

In an embodiment of the invention the separation element 8 is arranged to extend from the vacuum chamber 7 through the vacuum space to the distal end of each of the three or more actuator arms 5a, 5b, 5c for separating the three or more actuator arms 5a, 5b, 5 from the vacuum space 71.

In an embodiment of the invention the separation element 8 is arranged to extend from a wall of the vacuum chamber 7 through the vacuum space 71 to between the distal end of each of the three or more actuator arms 5a, 5b, 5c and the chamber plate 3 for separating the three or more actuator arms 5a, 5b, 5c from the vacuum space 71.

Figure 8:
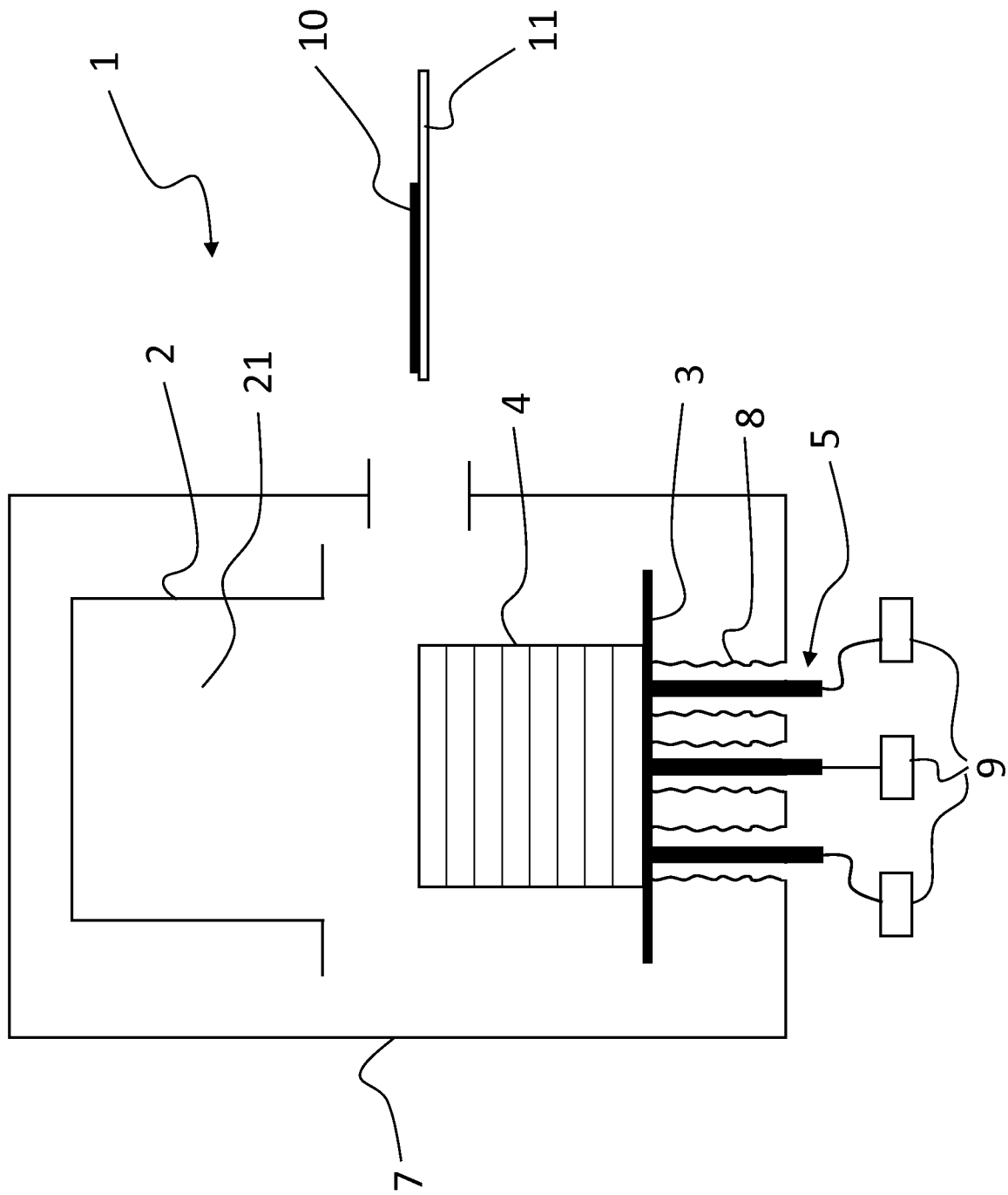
FIG. 8 shows still another embodiment of the apparatus according to the invention.

FIG. 8 shows the apparatus 1 according to the invention in which the reaction chamber 2 together with the chamber plate 3 are provided within the vacuum chamber 7 and the three actuator arms 5a, 5b, 5c are provided outside the vacuum chamber 7 such that the three actuator arms 5a, 5b, 5c are operating the chamber plate 3 arranged within the vacuum chamber 7. The separation element 8 forms part of the vacuum chamber 7 such that the vacuum conditions are maintained in the vacuum chamber 7 comprising the separation element 8. FIG. 8 shows an embodiment in which the three actuator arms 5a, 5b, 5c are separately separated from the vacuum chamber 7, however the three or more actuator arms 5a, 5b, 5c can be separated from the vacuum chamber 7 also together.

Figure 9:
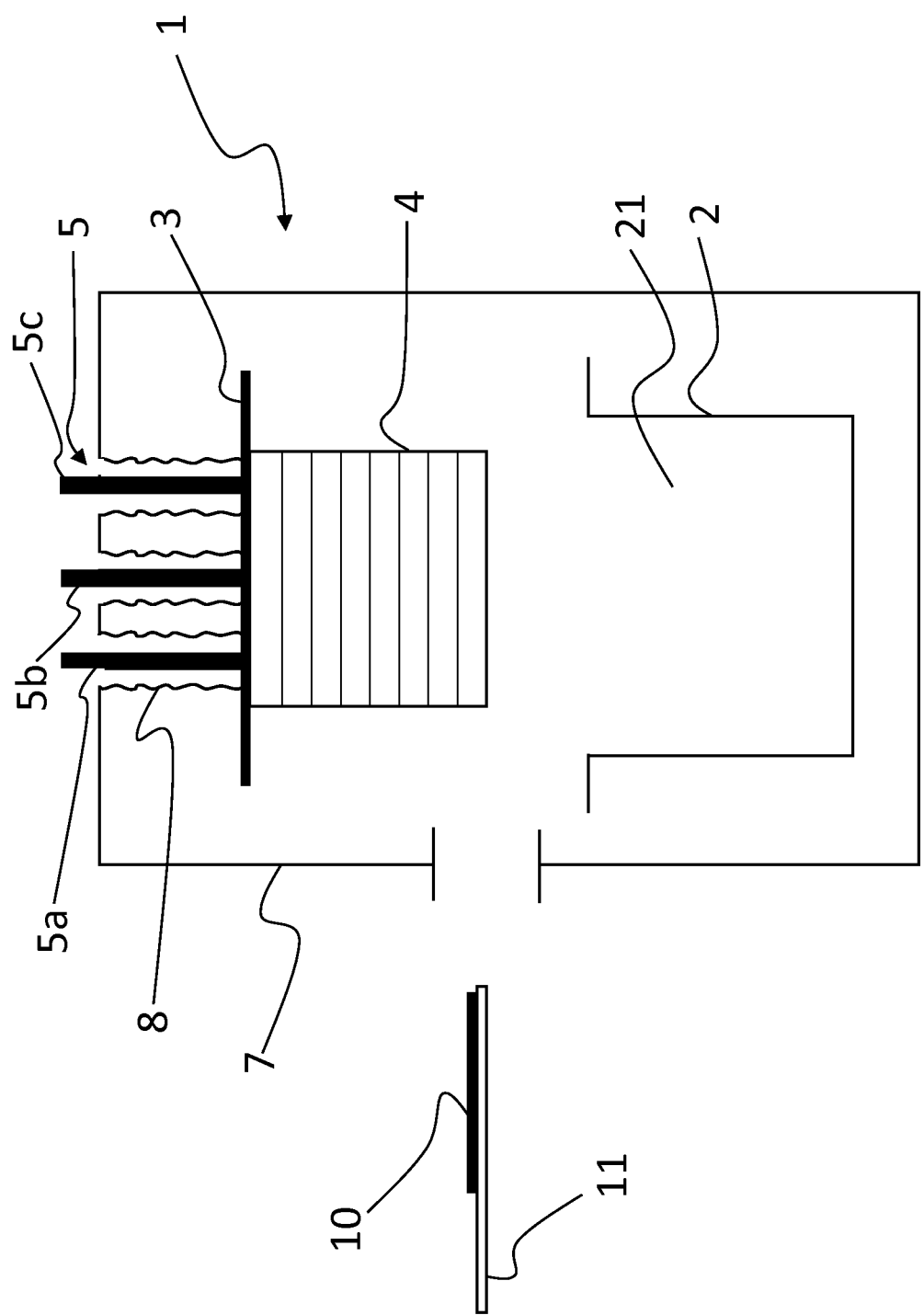
FIG. 9 shows yet another embodiment of the apparatus according to the invention.

FIG. 9 shows yet another embodiment of the apparatus according to the invention in which the chamber plate 3 is arranged to be moved inside the vacuum chamber 7 from the top part of the vacuum chamber 7 downwards. The substrate rack 4 is provided in connection with the chamber plate 3 such that the chamber plate 3 is arranged on top of the substrate rack 4. In other words, the substrate rack 4 is hanging from the chamber plate 3. In the embodiment shown in FIG. 9 the reaction chamber 2 is closed from the top of the reaction chamber 2 by moving the chamber plate 3 together with the substrate rack 4 toward the reaction chamber 2 such that the substrate rack is provided within the reaction chamber 2 and the chamber plate 3 is pressed against the reaction chamber 2. The chamber plate 3 is moved with the three (or more) actuator arms 5a, 5b, 5c having a connection to one or more motors 9 (not shown in the figure) actuating the actuator arms 5a, 5b, 5c. The actuator arms 5a, 5b, 5c are arranged outside the vacuum chamber 7 while the chamber plate is provided within the vacuum chamber 7. The separation element 8 extends between the body of vacuum chamber 7 and the chamber plate 7 and/or the distal end of the actuator arms 5a, 5b, 5c. Although not shown in the figure in detail the distal ends of the actuator arms may comprise an adjustment mechanism that receives the pressing force when the chamber plate 3 is pressed against the reaction chamber 2 to seal the connection between the chamber plate 3 and the reaction chamber 2.

The above presented figures also show the method according to the invention which the method comprises: providing an actuator arm mechanism 5 having three or more actuator arms 5a, 5b, 5c and connecting a distal end of each of the three or more actuator arms 5a, 5b, 5c to the chamber plate 3 such that a plane is defined on the chamber plate 3; moving the chamber plate 3 in the first direction A between an open position of the reaction chamber 2 and a closed position of the reaction chamber 2, and moving the chamber plate 3 to at least one predetermined loading position by the motor 9 which is connected to the actuator arm mechanism 5.

The motor 9 is preferably a servo motor and each of the actuator arms 5a, 5b, 5c may comprise an own motor 9 or preferably at least one of the actuator arms 5a, 5b, 5c is provided with its own motor 9 and the other actuator arms 5a, 5b, 5c have a common motor 9.

The method also comprises: providing an adjustment mechanism 6 to the actuator arm mechanism 5 by arranging the adjustment mechanism 6 in connection with at least one of the three or more actuator arms 5a, 5b, 5c; and adjusting an orientation of the chamber plate 3 in relation to the reaction chamber 2 by the adjustment mechanism 6.

The method further comprises moving the chamber plate 3 to the closed position for closing the reaction chamber 2 by the chamber plate 3; and adjusting the orientation of the chamber plate 3 relative to the reaction chamber 2 in the closed position by the adjustment mechanism 6 for tightening and/or sealing the connection between the chamber plate 3 and the reaction chamber 2. The moving the chamber plate 3 to the closed position comprises the steps of using the one or more motors 9 for moving the chamber plate 3 by the three or more actuator arms 5a, 5b, 5c and providing a connection between the chamber plate 3 and the reaction chamber 2. The adjusting the orientation of the chamber plate 3 relative to the reaction chamber 2 comprises the step of actuating the one or more motors 9 for pressing the chamber plate 3 against the reaction chamber 2 such that the adjustment mechanism 6 receives compression force from the one or more motors 9 and is compressed in a compressed form between the actuator arm 5a, 5b, 5c and the chamber plate 3. The adjustment mechanism 6 is arranged in connection with one or more actuator arms 5a, 5b, 5c.

The invention has been described above with reference to the examples shown in the figures. However, the invention is in no way restricted to the above examples but may vary within the scope of the claims.

The invention claimed is:

1. An apparatus for processing one or more substrates in a batch process by subjecting at least part of a surface of a substrate to alternating surface reactions of at least a first and second starting materials according to the principles of atomic layer deposition (ALD), the apparatus comprising:
    a reaction chamber forming a reaction space within the reaction chamber;
    a chamber plate for closing the reaction chamber such that a closed reaction space is formed,
    a motor arranged to move the chamber plate in a first direction (A) between an open position, in which the reaction chamber is open, and a closed position, in which the reaction chamber is closed, with the chamber plate,
    wherein the apparatus further comprises
        an actuator arm mechanism connected to said motor, the actuator arm mechanism having three or more actuator arms, each of the three or more actuator arms having a distal end, which the distal end is connected to the chamber plate, the distal ends of the three or more actuator arms define a plane on the chamber plate; and
        an adjustment mechanism in connection with at least one of the three or more actuator arms, said adjustment mechanism being arranged to adjust orientation of the chamber plate relative to the reaction chamber when the chamber plate is pressed against the reaction chamber to tighten and seal the connection between the chamber plate and the reaction chamber.

2. The apparatus according to claim 1, wherein the apparatus comprises two motors connected to the actuator arm mechanism such that one of the two motors is connected to one of the three or more actuator arms for moving one of the three or more actuator arms and the other one of the two motors is connected to the actuator arm mechanism for moving the remainder of the three or more actuator arms.

3. The apparatus according to claim 1, wherein the apparatus comprises three or more motors connected to the three or more actuator arms such that each of the three or more actuator arms comprising the motor are arranged to move each of the three or more actuator arms separately.

4. The apparatus according to claim 1, wherein the adjustment mechanism comprises a first adjustment mechanism which is arranged at the distal end of at least one of the three or more actuator arms such that the distal end of the at least one of the three or more actuator arms is connected to the chamber plate through the first adjustment mechanism.

5. The apparatus according to claim 1, wherein each of the three or more actuator arms having a proximal end, which is opposite to the distal end; and
    the adjustment mechanism comprises a second adjustment mechanism which is arranged at a proximal end of at least one of the three or more actuator arms.

6. The apparatus according to claim 5, wherein the first adjustment mechanism is a spring or an elastic member or a pneumatic member; or
    the second adjustment mechanism is a spring or an elastic member or a pneumatic member; or
    the first adjustment mechanism and the second adjustment mechanism is a spring or an elastic member or a pneumatic member.

7. The apparatus according to claim 1, wherein the three or more actuator arms are connected together such that a combined actuator arm mechanism is formed, said combined actuator arm mechanism having a common main actuator arm,
    at least one of the three or more actuator arms comprise a first adjustment mechanism which is arranged at a distal end of the at least one of the three or more actuator arms such that the distal end of the at least one of the three or more actuator arms is connected to the chamber plate through the first adjustment mechanism, and
    the motor is connected to the main actuator arm and arranged to move the main actuator arm in the first direction (A).

8. The apparatus according to claim 1, wherein:
    the motor is a servo motor; or
    the motor is a servo motor having a position determination feature.

9. The apparatus according to claim 1, wherein the apparatus further comprises:
    a vacuum chamber forming a vacuum space within the vacuum chamber such that the reaction chamber is provided inside a vacuum chamber; and
    a separation element provided to the vacuum chamber for separating the three or more actuator arms from the vacuum chamber such that the three or more actuator arms are operably connected to the chamber plate for moving the chamber plate inside the vacuum chamber between the open position and the closed position by the three or more actuator arms from outside of the vacuum chamber.

10. The apparatus according to claim 9, wherein:
    the separation element is extending from the vacuum chamber through the vacuum space to the chamber plate for separating the three or more actuator arms from the vacuum space; or
    the separation element extending from the vacuum chamber through the vacuum space to the distal end of each of the three or more actuator arms for separating the three or more actuator arms from the vacuum space; or the separation element extending from a wall of the vacuum chamber through the vacuum space to between the distal end of each of the three or more actuator arms and the chamber plate for separating the three or more actuator arms from the vacuum space.

11. The apparatus according to claim 9, wherein the separation element is an expandable element allowing movement of the three or more actuator arms while separating the three or more actuator arms from the vacuum space.

12. An apparatus according to claim 1, the apparatus further comprising:
 a substrate rack for holding a substrate batch comprising one or more substrates, said substrate rack is provided in connection with the chamber plate.

* * * * *